(12) United States Patent
Tao et al.

(10) Patent No.: US 6,191,360 B1
(45) Date of Patent: Feb. 20, 2001

(54) THERMALLY ENHANCED BGA PACKAGE

(75) Inventors: Su Tao, Kaohsiung; Han-Hsiang Huang, Pingtung Hsien; Kun-Ching Chen, Tainan; Chun-Chi Lee, Kaohsiung, all of (TW)

(73) Assignee: Advanced Semiconductor Engineering, Inc., Kaohsiung (TW)

( * ) Notice: Under 35 U.S.C. 154(b), the term of this patent shall be extended for 0 days.

(21) Appl. No.: 09/298,849

(22) Filed: Apr. 26, 1999

(51) Int. Cl.[7] .................................................. H01L 23/02
(52) U.S. Cl. .................. 174/52.4; 174/35 R; 361/707; 361/800; 257/659; 257/778
(58) Field of Search .................. 174/35 R, 52.4; 361/707, 800; 257/778, 659

(56) References Cited

U.S. PATENT DOCUMENTS

| | | | |
|---|---|---|---|
| 5,371,404 | * 12/1994 | Juskey et al. | 257/659 |
| 5,442,521 | * 8/1995 | Hirvonen et al. | 361/800 |
| 5,583,377 | * 12/1996 | Higgins, III | 257/707 |
| 5,726,079 | 3/1998 | Johnson | 438/106 |
| 5,811,317 | 9/1998 | Maheshwari et al. | 437/211 |
| 5,898,571 | * 4/1999 | Mertol | 361/704 |

* cited by examiner

Primary Examiner—William A. Cuchlinski, Jr.
Assistant Examiner—Ronnie Mancho
(74) Attorney, Agent, or Firm—Dykema Gossett PLLC

(57) ABSTRACT

A BGA package includes a substrate, a chip, and a heat spreader. The spreader covers the chip, a bottom part of the spreader is mounted on an upper surface of the substrate by an adhesive. The spreader shields Electro Magnetic Interference to the chip. In addition, the substrate is made of a built-up PCB.

6 Claims, 3 Drawing Sheets

THERMALLY ENHANCED BGA PACKAGE

BACKGROUND OF THE INVENTION

1. Field of the Invention

The present invention relates generally to an encapsulated BGA and more particularly to a flip chip package having a thermally conductive member encapsulated with the chip.

2. Description of the Related Art

Flip chip packages require a cover of some type over the silicone chip to protect it and to provide a larger flat surface for pick-and-place operations. However, any cover or encapsulant above the chip increases the thermal resistance path to an ambient environment and, hence, the operational temperature of the chip is increased.

U.S. Pat. No. 5,811,317, issued on Sep. 22, 1998 to Maheshwari et al., discloses a method for assembly of bare silicon die onto flexible or thin laminate substrates that minimizes substrate and die warpage induced after underfilled cure operations and at the same time reduces the cycle time for the assembly process. More specifically, an opposing layer of thermoset component is adhered to a balance plate (metal) or other material with an applicable coefficient of thermal expansion and modulus of elasticity on the top of the die. The offsetting layer of material causes the die to warp to the other side and as a result the two self opposing warpage effects neutralize themselves. Referring to FIG. 1, the flip chip package comprises a substrate 10, a chip 11, and a balance plate 12. The chip 11 is sandwiched between the substrate 10 and the balance plate 12. An underfill material 13 mounts the chip 11 to the substrate 10, and an overfill material 14 mounts the balance plate 12 to the chip 11. The drawback of the underfill material 13 is that after curing it is extremely rigid. Therefore, the balance plate 12 causes the chip 11 to warp to the other side and as a result the two self opposing warpage effects naturalize themselves. However, the balance plate 12 does not have the capability of heat conduction from the balance plate 12 to the substrate 10.

U.S. Pat. No. 5,726,079, issued on Mar. 10, 1998 to Johnson, discloses a thermally conductive planar member in thermally conductive communication with a flip chip encapsulated within a dielectric material that surrounds portions of the thermally conductive planar member, the flip-chip, and a predefined portion of a substrate member. The flip chip package has pick-and-place capability without the thermal resistance disadvantage of capped chip packages. Referring to FIG. 2, the flip chip package comprises a substrate 20, a chip 21 and a thermally conductive planar member 22. The chip 21, mounted on the substrate 20, is connected to the planar member 22 by an adhesive 23 therebetween. An encapsulant 24 surrounds an ambient environment of the chip 21 and the planar member 22. However, the planar member 22, for heat dissipation, conducts little heat from the planar member 22, and from the chip 21, to solder bumps of the substrate 20.

The present invention intends to provide a thermally enhanced BGA package which mitigates and overcomes the above problem.

SUMMARY OF THE INVENTION

The primary object of this invention is to provide a thermally enhanced BGA package, which comprises a heat spreader conducting heat from a top surface of a chip to the air as well as conducting heat from a bottom surface of the chip to the substrate.

The secondary object of this invention is to provide a thermally enhanced BGA package, which comprises a heat spreader shielding Electro Magnetic Interference (EMI) to a chip.

The other object of this invention is to provide a thermally enhanced BGA package, which comprises a heat spreader providing grounding effect on the substrate so as to reduce cross talk and characteristic impedance effects.

The other object of this invention is to provide a thermally enhanced BGA package, which comprises a heat spreader mitigating warpage effect.

In accordance with the present invention, a BGA package comprises a substrate, a chip, a pad and a heat spreader. The chip mounted on the substrate, which including the pad, is disposed in thermally conductive communication with the heat spreader that extends around the periphery of the pad. The heat spreader for heat dissipation conducts heat from the top surface of the chip to a heat dissipation member on the substrate, and to a pad. An encapsulant is exposed on the top of the spreader for heat convection. Therefore, heat on the top of the chip dissipates through conduction and convection at the same time.

Other objectives, advantages and novel features of the invention will become more apparent from the following detailed description when taken in conjunction with the accompanying drawings.

BRIEF DESCRIPTION OF THE DRAWINGS

The present invention will now be described with reference to the accompanying drawings wherein.

DETAILED DESCRIPTION OF THE INVENTION

Figure 3:
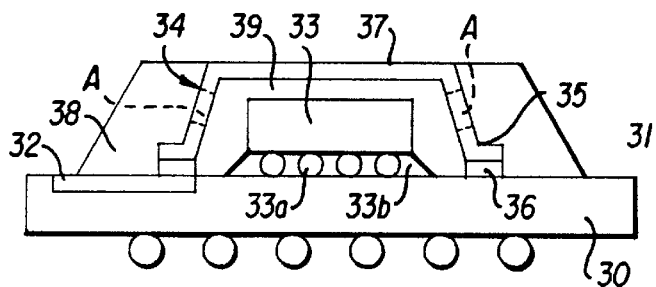
FIG. 3 is a sectional view along line 3—3 in FIG. 4 of a BGA package in accordance with the first embodiment of the present invention.
Figure 3A:
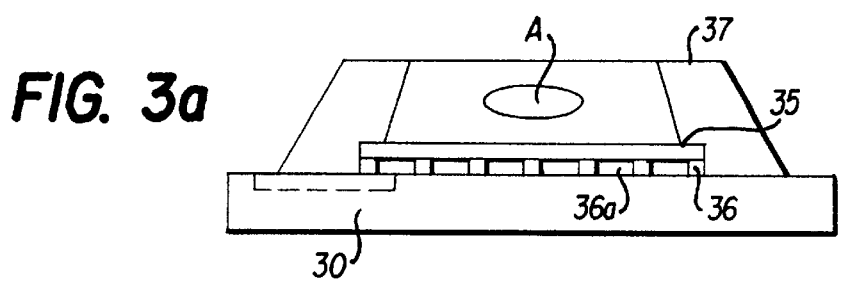
FIG. 3a is a side view of a BGA package in accordance with the first embodiment of the present invention.

Referring to FIG. 3, a BGA package in accordance with the first embodiment comprises a substrate 30, a pad 32, a chip 33, and a heat spreader 34. The pad 32, forming a mold gate, is mounted on an upper surface 31 of the substrate 30 to form a mold gate, thus the cured portion of an encapsulant material can be peeled from the mold gate of the upper surface 31 of the substrate 30. The chip 33 mounted on the substrate 30, which including the pad 32, is in thermally conductive communication with the heat spreader 34 that extends around the periphery of the pad 32. The encapsulating material is molded to form an encapsulant 38 on the substrate 30, to seal the chip 33.

Figure 4:
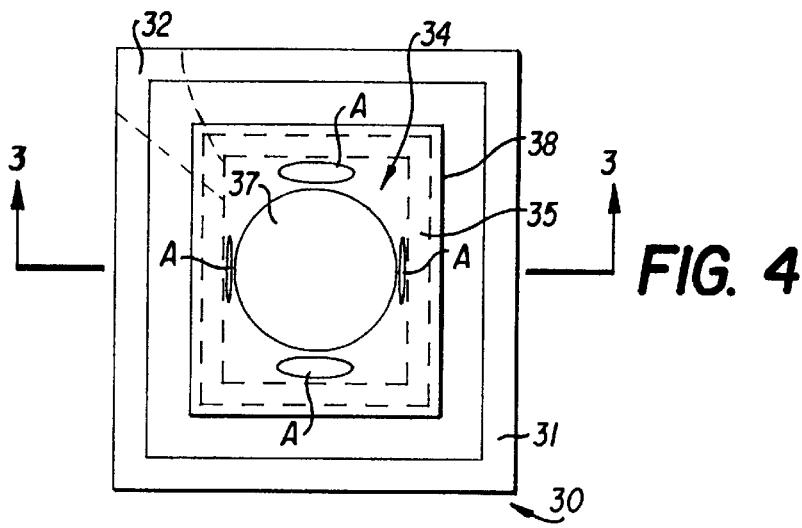
FIG. 4 is a top view of a BGA package in accordance with a second embodiment of the present invention.

Referring to FIGS. 3 and 4, the pad 32, for heat dissipation, is made of metal material, and disposed around the corner of the chip 33. The spreader 34 further comprises a plurality of holes A, through which the encapsulating material 39, flows into the spreader 34 during molding. The chip 33 is disposed in thermally conductive communication (by an adhesive material) with the heat spreader 34. A bottom part 35 of the spreader 34 comprises a plurality of protrusions 36 and extends around the periphery of the pad 32. For heat dissipation, the bottom part 35 of the spreader 34, is connected to the pad 32, to which is connected a ground plate (not shown). After the encapsulating material is cured, a top part 37 of the spreader 34 is exposed on a top of the encapsulant 38, so that some of the heat of the chip 33 is convected away from the top part 37 of the spreader 34 to the air. A sidewall 37a extends between the top part 37 and the bottom part 35 of the heat spreader 34. Heat from the bottom part of the chip 33 is conducted to the upper surface 31 of the substrate 30 by solder bumps 33a and underfill 33b. And heat from the top part of the chip 33 is conducted to an epoxy layer 39 of the encapsulant 38, and to the top of the spreader 34. For additional heat dissipation, some heat from the spreader 34 is convected from the top part 37 to the air and other heat is conducted from the bottom part 35 to the upper surface 31 of the substrate 30, and to the pad 32. It should be noted that heat from the bottom and top part of the chip 33 is being dissipated at the same time, so as to avoid deformation or warpage of the chip 33, which may be caused by the difference in coefficient of expansion (CTE) from the bottom and top part of the chip 33.

Figure 1:
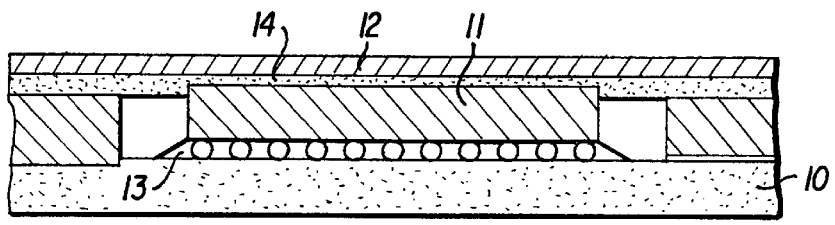
FIG. 1 is a side view of a flip chip package in accordance with U.S. Pat. No. 5,811,317.
Figure 2:
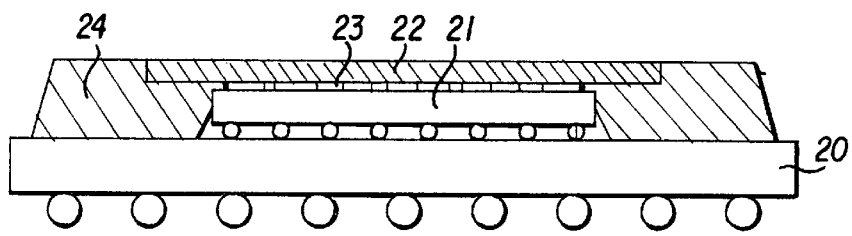
FIG. 2 is a side view of a flip chip package in accordance with U.S. Pat. No. 5,726,079.

Referring to FIGS. 1, 2 and 3, the spreader 34 of the present invention is compared with the balance plate 12 of U.S. Pat. No. 5,811,317 and the planar member 22 of U.S. Pat. No. 5,726,079. Some heat of the spreader 34 is convected to the air and at the same time other heat is conducted to the upper surface 31 of the substrate 30 and the pad 32. But the balance plate 12 and the planar member 22 have no connection to the substrate 10, 20, in that it is hard to conduct the heat of the balance plate 12 and heat of the planar member 22 to the substrate 10, 20.

A plurality of protrusions 36 provided on the bottom part 35 of the heat spreader 34 are attached to the upper surface 31 of the substrate 30 such that the bottom part 35 of the heat spreader 34 and the upper surface 31 of the substrate 30 together define a plurality of gaps 36a which connect through the inside of the heat spreader 34 and allow the encapsulating material 39 to flow conveniently through the gaps 36a towards the inside of the heat spreader 34 for molding.

Figure 5:
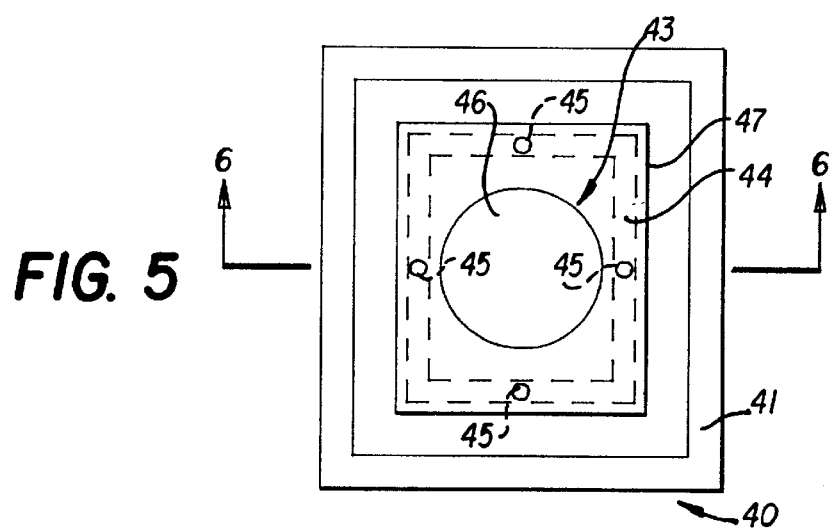
FIG. 5 is a top view of a BGA package in accordance with the second embodiment of the present invention.
Figure 6:
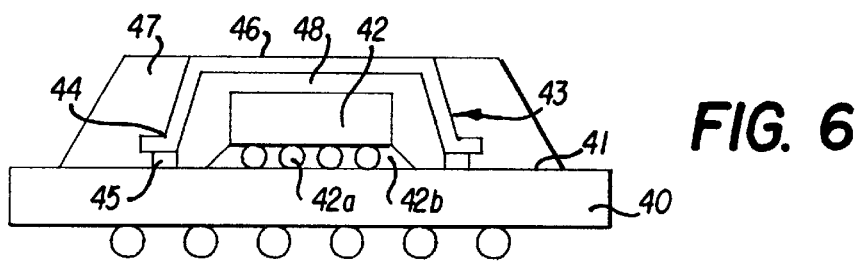
FIG. 6 is a sectional view, along line 6—6, in FIG. 5 of a BGA package in accordance with the second embodiment of the present invention.

Referring to FIGS. 5 and 6, the BGA package in accordance with the second embodiment comprises a substrate 40, a chip 42 and a heat spreader 43. The spreader 43 covers the chip 42, which is mounted on an upper surface 41 of the substrate 40. A bottom part 44 of the spreader 43 further comprises a plurality of protrusions 45 attached to the upper surface 41 of the substrate 40 by an adhesive material. In that, the bottom part 44 and the upper surface 41 together define a gap through which the encapsulating material 48 flows into the spreader 43 during molding. The encapsulating material molded to form an encapsulating 47 on the substrate 40 to seal the chip 42. After the encapsulating material is cured, a top part 46 of the spreader 43 is exposed on a top of the encapsulant 47, in such way that some of the heat of the chip 42 dissipates in convectional way from the top part 46 of the spreader 43 to the air. Heat from the bottom part of the chip 42 is conducted to the upper surface 41 of the substrate 40 by solder bumps 42a and underfill 42b. And heat from the top part of the chip 42 is conducted to an epoxy layer 48 of the encapsulant 47 and to the top of the spreader 43. Then, for additional heat dissipation, some heat of the spreader 43 is convected from the top part 46 to the air, and the other heat is conducted from the bottom part 44 to the upper surface 41 of the substrate 40.

Figure 7:
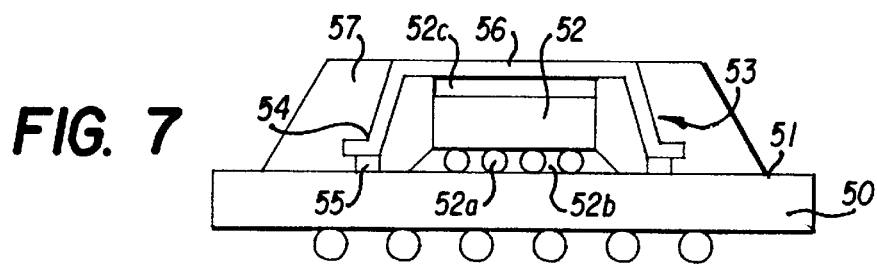
FIG. 7 is a sectional view of a BGA package in accordance with the third embodiment of the present invention.

Referring to FIG. 7, the BGA package in accordance with the third embodiment comprises a substrate 50, a chip 52 and a heat spreader 53. The spreader 53 covers the chip 52, which is mounted on an upper surface 51 of the substrate 50. A bottom part 54 of the spreader 53 further comprises a plurality of protrusions 55 attached to the upper surface 51 of the substrate 50 by an adhesive material. In that, the bottom part 54 and the upper surface 51 together define a gap through which the encapsulating material flow into the spreader 53, during molding. The encapsulating material is molded to form an encapsulating 57 on the substrate 50 to seal the chip 52. After the encapsulating material is cured, a top part 56 of the spreader 53 is exposed on a top of the encapsulant 57, in that some of heat of the chip 52 is dissipated in a convectional way from the top part 56 of the spreader 53 to the air. Heat from the bottom part of the chip 52 is conducted to the upper surface 51 of the substrate 50 by solder bumps 52a and underfill 52b. And heat from the top part of the chip 52 is conducted through an adhesive layer 52c to the top of the spreader 53. Then, for added heat dissipation, some heat of the spreader 53 is convected from the top part 56 to the air, and other heat is conducted from the bottom part 54 to the upper surface 51 of the substrate 50.

Figure 8:
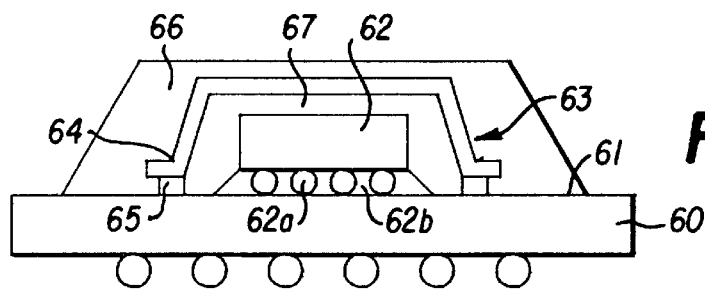
FIG. 8 is a sectional view of a BGA package in accordance with the fourth embodiment of the present invention.

Referring to FIG. 8, the BGA package in accordance with the fourth embodiment comprises a substrate 60, a chip 62 and a heat spreader 63. The spreader 63 covers the chip 62, which is mounted on an upper surface 61 of the substrate 60. A bottom part 64 of the spreader 63 further comprises a plurality of protrusions 65 attached to the upper surface 61 of the substrate 60 by an adhesive material. In that, the bottom part 64 and the upper surface 61 together define a gap through which the encapsulating material 68 flows into the spreader 63 during molding. The encapsulating material is molded to form an encapsulant 66 on the substrate 60 to seal the chip 62. Heat from the bottom part of the chip 62 is conducted to the upper surface 61 of the substrate 60, by solder bumps 62a and underfill 62b. And heat from the top part of the chip 62 is conducted to an epoxy layer 67 of the encapsulant 66 and the top of the spreader 63. Then, for heat dissipating, heat of the spreader 63 is conducted from the bottom part 64 to the upper surface 61 of the substrate 60.

Figure 9:
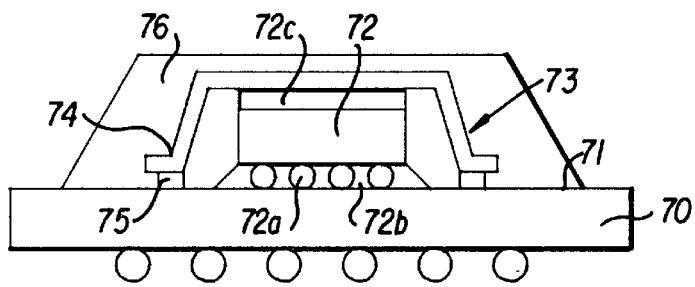
FIG. 9 is a sectional view of a BGA package in accordance with the fifth embodiment of the present invention.

Referring to FIG. 9, the BGA package in accordance with the fifth embodiment comprises a substrate 70, a chip 72 and a heat spreader 73. The spreader 73 covers the chip 72, which is mounted on an upper surface 71 of the substrate 70. A bottom part 74 of the spreader 73 further comprises a plurality of protrusions 75 attached to the upper surface 71 of the substrate 70 by an adhesive material. In that, the bottom part 74 and the upper surface 71 together define a gap through which the encapsulating material flows into the spreader 73 during molding. The encapsulating material is molded to form an encapsulant 76 on the substrate 70 to seal the chip 72. Heat from the bottom part of the chip 72 is conducted to the upper surface 71 of the substrate 70 by solder bumps 72a and underfill 72b. And heat from the top part of the chip 72 is conducted through an adhesive layer 72c to the top of the spreader 73. Then, for added heat dissipation, heat from the spreader 73 is conducted from the bottom part 74 to the upper surface 71 of the substrate 70.

Figure 10:
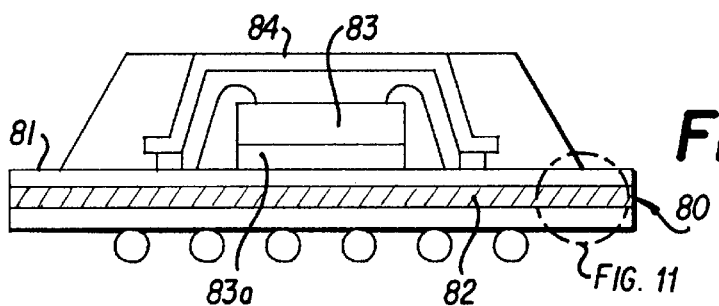
FIG. 10 is a sectional view of a BGA package in accordance with the sixth embodiment of the present invention.

Referring to FIG. 10, the BGA package in accordance with the sixth embodiment, comprises a substrate 80, a chip 83 and a heat spreader 84. The substrate 80 further comprises a metal layer 82 which provides an enhanced structure so as to avoid the substrate 80 bending under strain. For heat dissipation, heat of the chip 83 is conducted through an adhesive layer 83a and the spreader 84 to the substrate 80.

Figure 11:
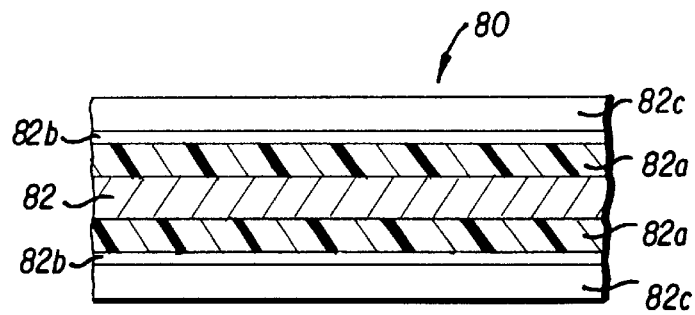
FIG. 11 is a partial enlarged view of FIG. 10 in accordance with the sixth embodiment of the present invention.

Referring to FIG. 11, the substrate 80 comprises the metal layer 82, two BT (Bismaleimide Triazine Resin) layers 82a, two routine layers 82b, and two films 82c. The metal layer 82 is sandwiched between the two BT layers, and the routine layers formed on the BT layers, and the films 82c formed on the routine layers.

Although the invention has been described in detail with reference to its presently preferred embodiments, it will be understood by one of ordinary skill in the art that various modifications can be made without departing from the spirit and the scope of the invention, as set forth in the appended claims.

What is claimed is:

1. A BGA package comprising:

a substrate having an upper surface with a metal pad disposed thereon, the pad forming a mold gate;

a chip mounted on the upper surface of the substrate;

a heat spreader having a bottom part, a top part and a sidewall between the bottom part and the top part, the heat spreader covering the chip which is mounted on the upper surface of the substrate;

a plurality of protrusions provided on the bottom part of the heat spreader, attached to the upper surface of the substrate such that the bottom part of the heat spreader and the upper surface of the substrate can together define a plurality of gaps which connect through the inside of the heat spreader, at least one protrusion in contact with the pad forming the molding gate;

a plurality of holes provided on the side wall of the heat spreader; and an encapsulating material covering the chip and the heat spreader by molding in a manner that the encapsulating material flows conveniently through the gaps defined by the bottom part of the heat spreader and the upper surface of the substrate as well as holes on the sidewall and air trapped inside the heat spreader is expelled therethrough;

whereby the heat generated from the chip is dissipated from the top part of the heat spreader and the bottom part of the heat spreader to the pad.

2. A BGA package as defined in claim 1, further comprising:

an encapsulating layer disposed between the chip and the heat spreader.

3. A BGA package as defined in claim 1, further comprising:

an adhesive layer disposed between the chip and the heat spreader.

4. A BGA package as defined in claim 1, wherein the top part of the heat spreader is exposed on the encapsulant.

5. A BGA package as defined in claim 1, wherein the top part of the heat spreader is covered by the encapsulant.

6. A BGA package as defined in claim 1, wherein the substrate is made of built-up PCB.

* * * * *